WIDE BAND LOGARITHMIC AMPLIFIER

Filed Jan. 6, 1967

INVENTOR.
LESTER E. PRATT Jr.
BY
George Fine
ATTORNEYS

United States Patent Office 3,524,074

Patented Aug. 11, 1970

3,524,074

WIDE BAND LOGARITHMIC AMPLIFIER

Lester E. Pratt, Jr., San Antonio, Tex., assignor to the United States of America as represented by the Secretary of the Air Force Filed Jan. 6, 1967, Ser. No. 607,860
Int. Cl. G06g 7/24
U.S. Cl. 307—230 3 Claims

ABSTRACT OF THE DISCLOSURE

An apparatus for compressing an electrical signal by utilizing a field effect transistor in conjunction with an operational amplifier with the field effect transistor biased to operate in the prepinch off region of its characteristic curve in a manner which provides logarithmic compression of an input signal over a frequency range in the order of DC to 500 kc.

This invention relates to a wide band logarithmic amplifier and more particularly to a wide band log-function field effect transistor circuit operating in conjunction with an operational amplifier and biased to operate in the prepinch off region of its characteristic curve in a manner which provides logarithmic compression of an input signal over a frequency range in the order of DC to 500 kc. In addition, the feedback resistor of the operational amplifier and the log field effect transistor circuit may be interchanged to provide an antilog curve of a logarithmic input signal and thus reconstruct the original input data.

The present invention provides a logarithmic amplifier which accepts an input signal of 60 db range and amplifies it on a logarithmic curve so as to be compatible with a tape recorder which could accept input signals of 30 db dynamic range. That is, this logarithmic amplifier makes it possible to take data of wide dynamic range and record all the useful data onto an instrument of limited signal to noise ratio by "compressing" the data into a logarithmic curve. This logarithmic compression of data is accomplished by means of a unique feedback arrangement around an operational amplifier. This unique feedback consists of the utilization of the logarithmic characteristics of a Field Effect Transistor (FET) operating in the prepinch off portion of the characteristic curve as one of the feedback elements. In the prepinch off portion of the characteristic curve of a FET, a gate bias can be selected that will approximate a log curve relationship of $I_d$ (drain current) and $V_{ds}$ (drain source voltage). In other words, the FET becomes a voltage variable resistor whose value changes as a logarithmic function.

The novel feature of this invention is the utilization of a FET (either N or P channel) in combination with an operational amplifier to produce the needed log wave. By utilizing a FET, this log curve is obtained in which there is no junction capacitance to restrict overall frequency response. That is, in a FET the drain to source connections are a single bar of either N or P material whose resistance will vary nonlinearily as a result of gate bias and the voltage and current across it. The equivalent circuit of the log FET for high frequency operation more nearly is a pure resistance with very low capacity. The only significant factor restricting the frequency response is the gain bandwidth of the operational amplifier.

The logarithmic amplifier of the present invention was developed to amplify and compress light signals as produced by a photoconductive silicon diode (EG and GSD-100). The required range of light signals was 60 db and resolution of flashes down to one microsecond rise and fall time was required. This meant a minimum frequency response of DC to 500 kc. through a logarithmic compressing amplifier. Conventional log amplifiers using log diodes as a feedback element or a function generator (diode and resistive elements) used as feedback elements were not satisfactory because of limited frequency response. The log amplifier of the present invention comprises 60 db of data so as to be compatible with a special DC to 500 kc. tape recorder of 30 db signal to noise ratio.

An object of the present invention is to provide a wide band logarithmic amplifier wherein a wide band log function field effect transistor circuit operating in conjunction with an operational amplifier provides logarithmic compression of an input signal over a frequency range extending from DC to a high alternating frequency.

Another object of the present invention is to provide a logarithmic amplifier by utilizing a feedback arrangement around an operational amplifier wherein the feedback arrangement consists of the utilization of the logarithmic characteristics of a Field Effect Transistor operating in the prepinch off portion of the characteristic curve as one of the feedback elements.

Yet another object of the present invention is to provide an antilog amplifier to reconstruct the compressed data.

Various other objects, advantages, and features of novelty which characterize the invention are pointed out with particularity in the claims annexed hereto and forming a part hereof. However, for a better understanding of the invention, its advantages, and objects attained by its use, reference should be had to the subjoining drawings, which form a further part hereof, and to the accompanying descriptive matter, in which there is illustrated and described embodiments of the present invention.

Figure 1:
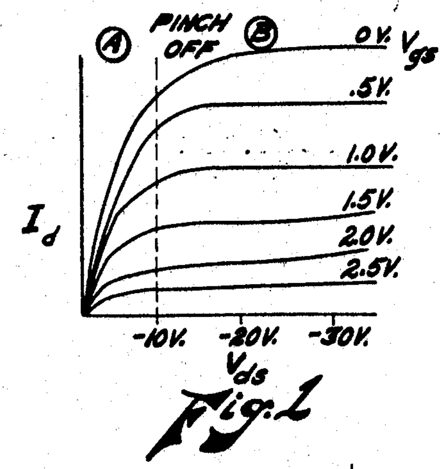
FIG. 1 illustrates the characteristic curves of a field effect transistor used as a voltage variable resistance.

The basic technique of the logarithmic amplifier of the present invention is based upon the application of the field effect transistor (FET) as a voltage variable resistance (VVR). This means using it in region "A" as shown in characteristic curve of FIG. 1. Region "A" is in the "pinch off" area.

Figure 2:
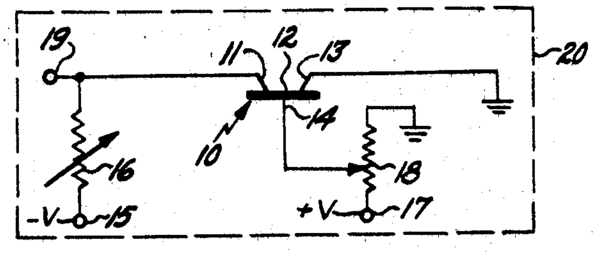
FIG. 2 shows a schematic diagram of a field effect transistor circuit utilized in the present invention.
Figure 3:
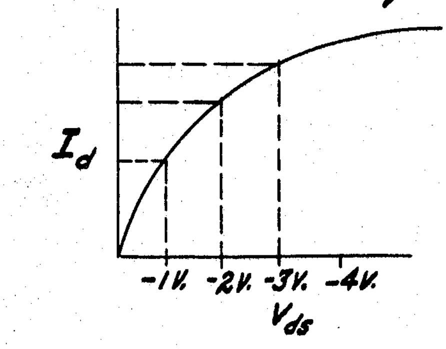
FIG. 3 illustrates a log curve relationship between $I_d$ and $V_{gs}$ provided by the circuit of FIG. 2.

Now referring to FIG. 2, there is shown field effect transistor circuit 20 which includes field effect transistor 10 having signal input terminal 19. Field effect transistor 10 includes drain 11 and source 13 separated by channel 12 whose conductance is controlled by gate electrode 14. Drain electrode 11 receives a negative voltage from terminal 15 by way of variable resistor 16 and gate electrode 14 receives a positive voltage from terminal 17 by way of potentiometer 18. Source electrode 13 is connected directly to ground. With no signal current input, no voltage would exist between the drain electrode 11 and source electrode 13 of field effect transistor 10. As signal current increases a voltage will be developed across the drain-source depending upon the setting of the gate bias. With the FET gate bias set to the proper point of the hereinbefore mentioned pinch-off area of region "A" of FIG. 1 by adjusting potentiometer 18, a logarithmic curve relationship between $I_d$ (drain current) and $V_{gs}$ (voltage between gate and source) is obtained for the limits of input current desired (60 db) as illustrated in the curve of FIG. 3. That is:

$$R_{\log}=\frac{V_{ds}}{I_d}$$

where $I_d$ varies as a log function of $V_{ds}$. A field effect transistor is utilized where the gate bias can be adjusted to give a log resistance of relatively high value such as the 2N2386P channel made by Texas Instruments or Union Carbide.

Figure 4:
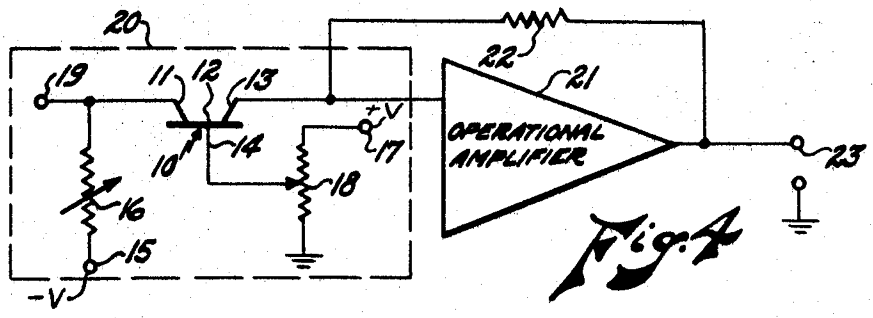
FIG. 4 illustrates a diagram partly in block and partly in schematic form of one of the preferred embodiments of the present invention to provide a logarithmic amplifier for comparison of data.

Now referring to FIG. 4, there is shown field effect transistor circuit 20 of FIG. 2 utilized in combination with operational amplifier 21 and feedback resistor 22 ($R_f$). Operational amplifier 21 is conventional and may be of the Nexus FSL-6 type.

With field effect transistor circuit 20 used as the input to operational amplifier 21, the output from terminals 23 will vary as a logarithmic function as determined by the ratio of feedback resistance 22 ($R_f$) to resistance ($R_1$) of field effect transistor 10.

The initial gain of operational amplifier 21 will be relatively large since the beginning of the curve shown in FIG. 3 at point A is quite steep ($R_1$ is low). As the signal input increases $R_1$ becomes relatively larger as a log function thus reducing gain and giving a log output. The value of the feedback resistor, $R_f$, is limited by the required gain bandwidth of operational amplifier 21. Generally speaking, the value of log resistance for an FET transistor should be selected for low values of current and voltage across the FET and a low gate bias, that is, a relatively high value of log resistance. Then the ratio of $R_f$ to $R_1$ should be within the gain bandwidth product desired if the operational amplifier is not to restrict frequency response. The ability of the logarithmic amplifier of the present invention to logarithmically compressed and pass frequencies from DC to 500 kc. were excellent compared to other types of log amplifiers.

Figure 5:
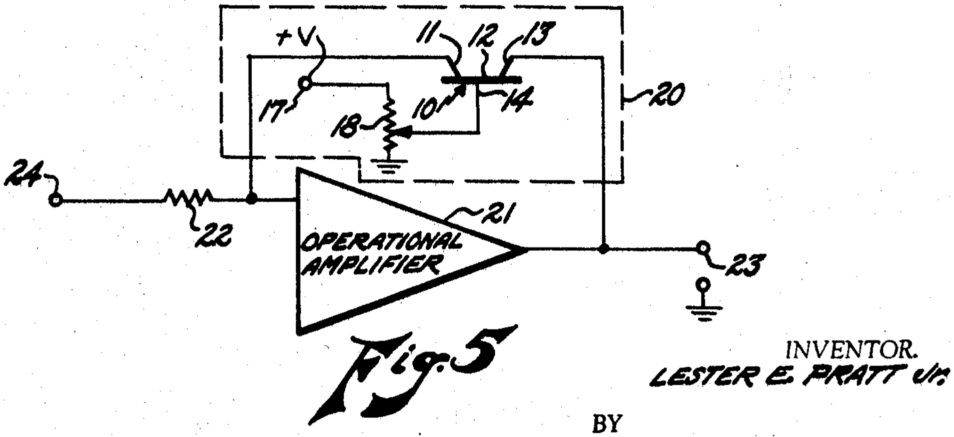
FIG. 5 illustrates a diagram partly in block and partly in schematic form of another embodiment of the present invention to provide an antilog of a log curve to reconstruct the original compressed data.

Now referring to FIG. 5, there is shown the logarithmic FET current 20 with feedback resistor 22 of FIG. 4 but of an interchanged relationship so that the input signal terminal 24 is connected to operational amplifier by resistor 22 and logarithmic FET circuit 20 is the feedback element for operational amplifier 21. It is noted that log FET circuit 20 has omitted therefrom terminal 15 and variable resistor 16. However this circuit as shown in FIG. 5 provides an output at terminal 23 which is an antilog of a log curve which permits the reconstruction of the original compressed data.

Numerous objects and advantages of the invention have been set forth in the foregoing description, together with details of the structure and function of the invention, and the novel features thereof are pointed out in the appended claims. This disclosure, however, is illustrative only, and changes may be made in detail, especially in matters of arrangement of parts, within the principles of the invention to the full extent indicated by the broad general meaning of the terms in which the appended claims are expressed.

What is claimed is:

1. A wide band logarithmic amplifier for the compression of an electrical signal fed thereto comprising a field effect transistor receiving at the input thereof said electrical signal, said transistor being biased to operate in the prepinch off region of the characteristic curve thereof, an amplifier including an input and output and having an operating frequency range from direct current to a high alternating frequency, said amplifier receiving the output signal from said field effect transistor, and a resistor interconnecting said output and said input of said amplifier.

2. A wide band logarithmic amplifier as described in claim 1 wherein said field effect transistor includes drain, source, and gate electrodes, and a channel separating said drain and source electrodes, the conductance of said channel being controlled by said gate electrode, said drain electrode receiving said signal to be compressed, said source electrode being connected to said input of said amplifier, and said gate electrode being connected to a positive voltage by way of a potentiometer to provide a gate bias setting the proper operating point to obtain a log curve relationship so that the drain electrode current varies as a log function of the voltage across said drain and source electrodes.

3. In a wide band logarithmic amplifier as described in claim 2 further including a variable resistor interconnecting said drain electrode and a negative voltage source.

References Cited

UNITED STATES PATENTS

| | | | |
|---|---|---|---|
| 3,237,028 | 2/1966 | Gibbons | 328—145 |
| 3,284,726 | 11/1966 | Kotecki | 333—14 |
| 3,320,532 | 5/1967 | Watters | 328—145 |
| 3,369,128 | 2/1968 | Pearlman | 328—145 |
| 3,293,450 | 12/1966 | Gibbons | 328—145 |
| 3,257,631 | 6/1966 | Evans | 330—28 |

OTHER REFERENCES

"Unifets As Voltage-Controlled Resistors," Siliconix Inc., application tip, July 15, 1963.

DONALD D. FORRER, Primary Examiner

H. A. DIXON, Assistant Examiner

U.S. Cl. X.R.

307—304; 328—145